US009331084B2

(12) United States Patent
Ju et al.

(10) Patent No.: US 9,331,084 B2
(45) Date of Patent: May 3, 2016

(54) METHOD OF MANUFACTURING A SEMICONDUCTOR DEVICE AND ADJUSTING THRESHOLD VOLTAGES IN THE SAME

(71) Applicant: Semiconductor Manufacturing International (Shanghai) Corporation, Shanghai (CN)

(72) Inventors: Jianhua Ju, Shanghai (CN); Shuai Zhang, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/591,716

(22) Filed: Jan. 7, 2015

(65) Prior Publication Data
US 2015/0200194 A1    Jul. 16, 2015

(30) Foreign Application Priority Data
Jan. 13, 2014    (CN) .......................... 2014 1 0014510

(51) Int. Cl.
*H01L 27/11*    (2006.01)
*H01L 29/66*    (2006.01)

(52) U.S. Cl.
CPC ...... *H01L 27/1104* (2013.01); *H01L 29/66492* (2013.01); *H01L 29/66795* (2013.01)

(58) Field of Classification Search
CPC .................... H01L 27/1104; H01L 29/66492; H01L 29/66795
See application file for complete search history.

(56) References Cited

U.S. PATENT DOCUMENTS

| | | | | |
|---|---|---|---|---|
| 2008/0308848 A1* | 12/2008 | Inaba | ................... | G11C 11/412 257/255 |
| 2011/0317485 A1* | 12/2011 | Liaw | ....................... | H01L 27/11 365/182 |
| 2012/0299106 A1* | 11/2012 | Mann | .............. | H01L 21/823821 257/351 |

* cited by examiner

*Primary Examiner* — Mohammad Islam
*Assistant Examiner* — John P Dulka
(74) *Attorney, Agent, or Firm* — Innovation Counsel LLP

(57) ABSTRACT

A method of manufacturing a semiconductor device is provided. The method includes forming a fin structure on a semiconductor substrate and forming a well region in the semiconductor substrate by ion implantation so as to form transistors. The transistors include a pull-up transistor, a transfer gate transistor, and a pull-down transistor of a SRAM cell. The ion implantation is used to adjust threshold voltages of the transistors. Standard threshold voltage (SVt) ion implantation conditions are used to adjust a threshold voltage of the pull-up transistor and a threshold voltage of the transfer gate transistor, and low threshold voltage (LVt) ion implantation conditions are used to adjust a threshold voltage of the pull-down transistor.

12 Claims, 3 Drawing Sheets

METHOD OF MANUFACTURING A SEMICONDUCTOR DEVICE AND ADJUSTING THRESHOLD VOLTAGES IN THE SAME

CROSS-REFERENCE TO RELATED APPLICATION

This application claims priority to Chinese Patent Application No. 201410014510.4 filed on Jan. 13, 2014, the disclosure of which is incorporated herein by reference in its entirety.

BACKGROUND

1. Technical Field

The present disclosure relates to the field of semiconductor technology and more particularly, to a method of manufacturing a semiconductor device.

2. Description of the Related Art

In the field of semiconductor technology, a static random-access memory (SRAM) device is a type of semiconductor device that is widely used in computers, mobile phones, digital cameras, and other electronic devices. In some SRAM devices, a fin-type field effect transistor (FinFET) may be used to increase the memory density and performance of a SRAM cell.

It is known that reducing the size of the SRAM cell can improve device performance. Although the width of the Fin-FET can be adjusted by changing its quantum number, the change may alter the characteristics of the semiconductor device. When the quantum number is changed, it may be difficult to use values obtained from the layout design of a SRAM device including the FinFET, since the design values could be different from the actual values of the manufactured device.

Generally, there are two methods to adjust the $\alpha$, $\beta$, and $\gamma$ ratios of a SRAM device to improve device performance, as described below.

In one method, different number of fin structures may be selected for the pull-up (PU) transistor, transfer gate (PG) transistor, and pull-down (PD) transistor. The number of fin structures may be provided in any combination, for example, (1, 1, 1), (1, 1, 2), or (1, 2, 3). For example, in the (1, 2, 3) combination, there is one fin for the pull-up (PU) transistor, two fins for the transfer gate (PG) transistor, and three fins for the pull-down (PD) transistor.

In another method, fin structures having different heights may be selected for the pull-up (PU) transistor, transfer gate (PG) transistor, and pull-down (PD) transistor of the SRAM device.

However, the above methods for adjusting the $\alpha$, $\beta$, and $\gamma$ ratios of a SRAM device have several deficiencies. For example, using different number of fin structures for the different transistors could alter (increase) the size of the SRAM cell. Also, using fin structures of different heights increases the complexity of the manufacturing process since it is often difficult to control the varying heights during fabrication.

Accordingly, there is a need for an improved method of manufacturing a semiconductor device. In particular, there is a need for a method that can be used to fabricate a SRAM device which meets performance specifications.

SUMMARY

The present disclosure addresses at least the above deficiencies in the existing methods of manufacturing a semiconductor device including a SRAM device.

According to one embodiment of the inventive concept, a method of manufacturing a semiconductor device is provided. The method includes forming a fin structure on a semiconductor substrate, and forming a well region in the semiconductor substrate by ion implantation so as to form transistors. The transistors include a pull-up (PU) transistor, a transfer gate (PG) transistor, and a pull-down (PD) transistor of a static random-access memory (SRAM) cell. The ion implantation is used to adjust threshold voltages of the transistors, whereby standard threshold voltage (SVt) ion implantation conditions are used to adjust a threshold voltage of the PU transistor and a threshold voltage of the PG transistor, and low threshold voltage (LVt) ion implantation conditions are used to adjust a threshold voltage of the PD transistor.

In one embodiment, the method may further include forming a gate electrode for each transistor.

In one embodiment, the method may further include performing lightly doped drain (LDD) ion implantation and pocket area (PKT) ion implantation on the transistors of the SRAM cell.

In one embodiment, P-type high-threshold voltage (PHVT) ion implantation conditions may be used for the LDD ion implantation and PKT ion implantation of the PU transistor; N-type standard threshold voltage (NSTV) ion implantation conditions may be used for the LDD ion implantation and PKT ion implantation of the PG transistor; and N-type low-threshold voltage (NLVT) ion implantation conditions may be used for the LDD ion implantation and PKT ion implantation of the PD transistor.

In one embodiment, the SRAM cell may have an $\alpha$ ratio, a $\beta$ ratio, and a $\gamma$ ratio. The $\alpha$ ratio may be a ratio of a saturation current of the PG transistor to a saturation current of the PU transistor; the $\beta$ ratio may be a ratio of a saturation current of the PD transistor to a saturation current of the PG transistor; and the $\gamma$ ratio may be a ratio of a saturation current of the PU transistor to a saturation current of the PD transistor.

In one embodiment, the PHVT ion implantation conditions for the PU transistor and the NSTV ion implantation conditions for the PG transistor may be adjusted such that the $\alpha$ ratio of the SRAM cell is greater than 1.5.

In one embodiment, the $\alpha$ ratio of the SRAM cell may be about 2.

In one embodiment, the PHVT ion implantation conditions for the PU transistor, the NSTV ion implantation conditions for the PG transistor, and the NLVT ion implantation conditions for the PD transistor may be adjusted such that the $\beta$ ratio of the SRAM cell is greater than 1.2 and the $\gamma$ ratio of the SRAM cell is less than 0.6.

In one embodiment, when forming the gate electrode for each transistor of the SRAM cell: a critical dimension (CD) of the gate electrode of the PU transistor may be increased such that the $\alpha$ ratio of the SRAM cell is greater than 1.5 and the $\gamma$ ratio of the SRAM cell is less than 0.6.

In one embodiment, the CD of the gate electrode of the PU transistor may be increased using optical proximity correction (OPC) techniques.

In one embodiment, when forming the gate electrode for each transistor: a critical dimension (CD) of the gate electrode of the PD transistor may be reduced so as to reduce the $\gamma$ ratio of the SRAM cell.

In one embodiment, the CD of the gate electrode of the PD transistor may be reduced using optical proximity correction (OPC) techniques.

In one embodiment, the transistors may include other transistors of the semiconductor device excluding the PU, PG, and PD transistors of the SRAM cell, and the method may further include performing the LDD ion implantation and PKT ion implantation on the other transistors of the semiconductor device.

In one embodiment, the method may further include forming a source electrode and a drain electrode for each transistor of the semiconductor device including the PU, PG, and PD transistors of the SRAM cell.

In one embodiment, the gate electrode may be a polysilicon gate.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION

Various embodiments of the inventive concept are next described in detail with reference to the accompanying drawings. It is noted that the following description of the different embodiments is merely illustrative in nature, and is not intended to limit the inventive concept, its application, or use. The relative arrangements of the steps set forth in these embodiments do not limit the scope of the inventive concept unless otherwise specifically stated. In addition, techniques, methods, and devices as known by those skilled in the art, although omitted in some instances, are intended to be part of the specification where appropriate.

The terminology used herein is for describing particular embodiments and should not be construed as limiting the inventive concept. When used herein, the singular forms "a", "an" and "the" are intended to include plural forms as well unless specified otherwise. It should also be understood that the term "comprising" when used in this specification, encompasses the listed features, integers, steps, operations, elements, and/or components, but is not exclusive. For example, one or more other features, integers, steps, operations, elements, components, and/or groups may be added. When used herein, the term "and/or" includes any and all combinations of the associated listed items.

It should be understood that the inventive concept is not limited to the embodiments described herein. Rather, the inventive concept may be modified in different ways to realize different embodiments.

Figure 1:
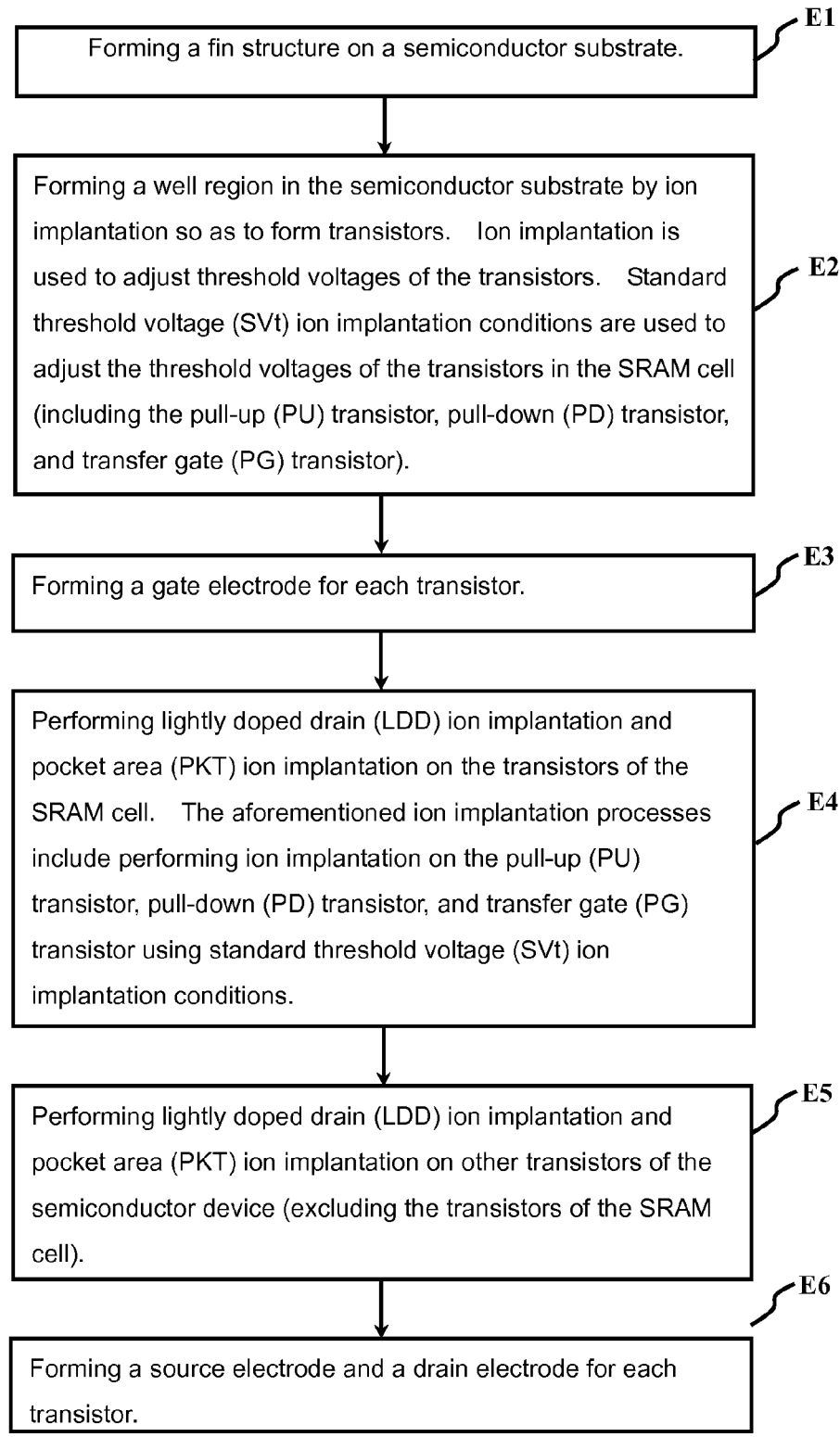
FIG. 1 is a flowchart illustrating a method of manufacturing a semiconductor device.

FIG. 1 is a flowchart illustrating a method of manufacturing a semiconductor device. Specifically, FIG. 1 illustrates a method of manufacturing a SRAM device including a FinFET. The method generally includes the following steps.

In Step E1, a fin structure is formed on a semiconductor substrate. The semiconductor substrate may include different types of semiconductor substrates. The fin structure may be formed using various semiconductor fabrication methods known to those skilled in the art.

In Step E2, a well region is formed in the semiconductor substrate by ion implantation so as to form transistors. The transistors may include a pull-up (PU) transistor, a pull-down (PD) transistor, and a transfer gate (PG) transistor of a SRAM cell. Ion implantation is used to adjust threshold voltages (Vt) of the transistors. For example, standard threshold voltage (SVt) ion implantation conditions are used to adjust the threshold voltages of the transistors of the SRAM cell. Specifically, the standard threshold voltage (SVt) ion implantation conditions are used to adjust the threshold voltages of the pull-up (PU) transistor, pull-down (PD) transistor, and transfer gate (PG) transistor of the SRAM cell.

In Step E3, a gate electrode is formed for each transistor. The gate electrode may be formed, for example, using a polysilicon gate process.

In Step E4, lightly doped drain (LDD) ion implantation and pocket area (PKT) ion implantation are performed on the transistors of the SRAM cell. The aforementioned ion implantation processes in Step E4 include performing ion implantation on the pull-up (PU) transistor, pull-down (PD) transistor, and transfer gate (PG) transistor using standard threshold voltage (SVt) ion implantation conditions.

In Step E5, lightly doped drain (LDD) ion implantation and pocket area (PKT) ion implantation are performed on other transistors of the semiconductor device (excluding the transistors of the SRAM cell). The other transistors may include a core transistor. The aforementioned ion implantation processes in Step E5 generally include standard threshold voltage (SVt) ion implantation and high threshold voltage (HVt) ion implantation.

As noted in Steps E4 and E5, the LDD ion implantation and PKT ion implantation for the transistors (PU, PD, and PG) of the SRAM cell are performed separately from the LDD ion implantation and PKT ion implantation for the other transistors (e.g. core transistors) of the semiconductor device.

In Step E6, a source electrode and a drain electrode are formed for each transistor. The source and drain electrodes may be formed using ion implantation or any other suitable processes.

Accordingly, a SRAM device including a FinFET may be formed using Steps E1 through E6 described above.

Figure 2:
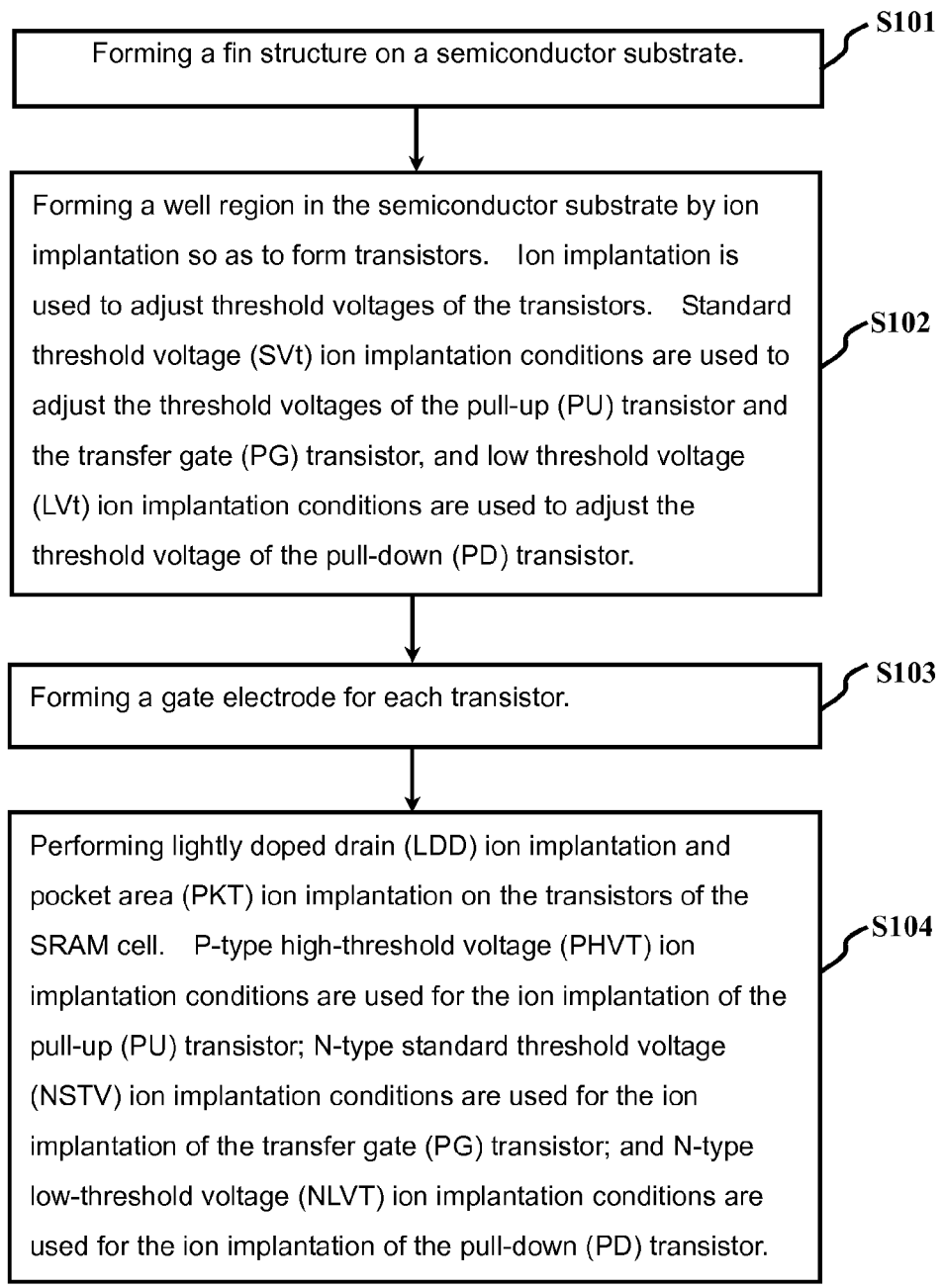
FIG. 2 is a flowchart illustrating a method of manufacturing a semiconductor device according to an embodiment.
Figure 3:
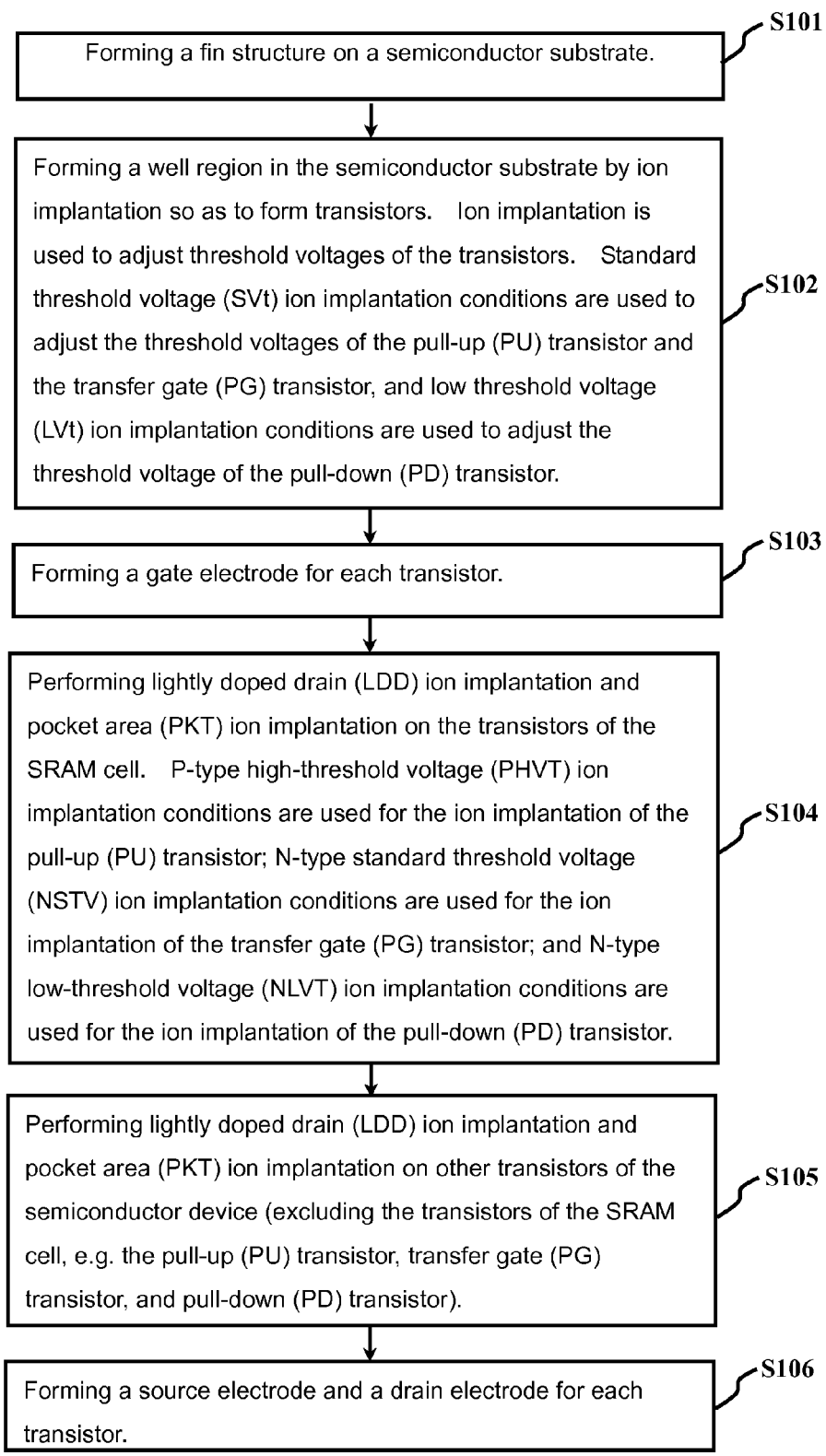
FIG. 3 is a flowchart illustrating a method of manufacturing a semiconductor device according to another embodiment.

FIGS. 2 and 3 are flowcharts illustrating a method of manufacturing a semiconductor device according to different embodiments. The method may be used to manufacture a SRAM device having a fin-type field effect transistor (FinFET) or a semiconductor device including the aforementioned SRAM device.

Referring to FIG. 2, the method includes the following steps:

Step S101: Forming a fin structure on a semiconductor substrate.

Step S102: Forming a well region in the semiconductor substrate by ion implantation so as to form transistors. The transistors include a pull-up (PU) transistor, a pull-down (PD) transistor, and a transfer gate (PG) transistor of a SRAM cell. Ion implantation is used to adjust threshold voltages of the transistors. Specifically, standard threshold voltage (SVt) ion implantation conditions are used to adjust the threshold voltages of the pull-up (PU) transistor and the transfer gate (PG) transistor, and low threshold voltage (LVt) ion implantation conditions are used to adjust the threshold voltage of the pull-down (PD) transistor.

Step S103: Forming a gate electrode for each transistor.

Step S104: Performing lightly doped drain (LDD) ion implantation and pocket area (PKT) ion implantation on the transistors of the SRAM cell. P-type high-threshold voltage (PHVT) ion implantation conditions are used for the ion implantation of the pull-up (PU) transistor; N-type standard threshold voltage (NSTV) ion implantation conditions are used for the ion implantation of the transfer gate (PG) transistor; and N-type low-threshold voltage (NLVT) ion implantation conditions are used for the ion implantation of the pull-down (PD) transistor.

The method in FIG. 3 includes Steps S101 through S104 of FIG. 2. In addition, the method in FIG. 3 includes the following steps:

Step S105: Performing lightly doped drain (LDD) ion implantation and pocket area (PKT) ion implantation on other transistors of the semiconductor device (excluding the transistors of the SRAM cell, e.g. the pull-up (PU) transistor, transfer gate (PG) transistor, and pull-down (PD) transistor).

Step S106: Forming a source electrode and a drain electrode for each transistor.

Next, the embodiments of FIGS. 2 and 3 will be described in more detail as follows.

In Step S101, the fin structure is formed on the semiconductor substrate. The semiconductor substrate may include different types of semiconductor substrates. The fin structure may be formed using various semiconductor fabrication methods known to those skilled in the art.

In Step S102, the well region is formed in the semiconductor substrate by ion implantation so as to form the transistors. As previously mentioned, the transistors include the pull-up (PU) transistor, pull-down (PD) transistor, and transfer gate (PG) transistor of the SRAM cell.

The threshold voltage (Vt) of each transistor may be adjusted by controlling the ion implantation conditions. In the present disclosure, "standard threshold voltage (SVt) ion implantation conditions" refer to the ion implantation conditions for forming a transistor having a standard threshold voltage (SVt), and "low threshold voltage (LVt) ion implantation conditions" refer to the ion implantation conditions for forming a transistor having a low threshold voltage (SVt).

Step S102 in the exemplary method of FIG. 2 differs from Step E2 in the method of FIG. 1 as follows. In Step S102 (FIG. 2), the standard threshold voltage (SVt) ion implantation conditions are used to adjust the threshold voltages of the pull-up (PU) transistor and the transfer gate (PG) transistor, and the low threshold voltage (LVt) ion implantation conditions are used to adjust the threshold voltage of the pull-down (PD) transistor. In contrast, in Step E2 (FIG. 1), the standard threshold voltage (SVt) ion implantation conditions are used to adjust the threshold voltages of the pull-up (PU), transfer gate (PG), and pull-down (PD) transistors of the SRAM cell.

In Step S103, the gate electrode is formed for each transistor. The gate electrode may be formed, for example, using a polysilicon gate process. In one embodiment, sidewalls and other components may be formed on the sides of the gate electrode. When forming the gate electrode, the critical dimension (CD) of the pull-up (PU) transistor may be increased and/or the critical dimension (CD) of the pull-down (PD) transistor may be reduced, so as to produce a SRAM device having $\alpha$, $\beta$, and $\gamma$ ratios that meet device specifications.

In the present embodiment, $\alpha$ is the ratio of the saturation current (IDST) of the transfer gate (PG) transistor to the saturation current (IDST) of the pull-up (PU) transistor; $\beta$ is the ratio of the saturation current (IDST) of the pull-down (PD) transistor to the saturation current (IDST) of the transfer gate (PG) transistor; and $\gamma$ is the ratio of the saturation current (IDST) of the pull-up (PU) transistor to the saturation current (IDST) of the pull-down (PD) transistor.

In a preferred embodiment, optical proximity correction (OPC) techniques may be used to increase the critical dimension (CD) of the gate electrode of the pull-up (PU) transistor and/or reduce the critical dimension (CD) of the gate electrode of the pull-down (PD) transistor. The use of optical proximity correction (OPC) techniques provides several advantages. For example, additional masks are not required, and the layout design of the SRAM device need not be changed. It should be noted that changing the layout design of the SRAM device could change the size (dimensions) of the SRAM cell, which adds complexity to the manufacturing process.

In one embodiment, the critical dimension (CD) of the gate electrode of the pull-up (PU) transistor may be increased so that $\alpha$ is greater than 1.5 and $\gamma$ is less than 0.6. In a preferred embodiment, $\alpha$ is about 2. When increasing the critical dimension (CD) of the gate electrode of the pull-up (PU) transistor, the critical dimensions of the other transistors should be kept constant or adjusted accordingly to obtain the desired $\alpha$ and $\gamma$ ratios. In addition, the critical dimension (CD) of the gate electrode of the pull-down (PD) transistor may be reduced so as to further reduce the $\gamma$ ratio.

In Step S104, lightly doped drain (LDD) ion implantation and pocket area (PKT) ion implantation are performed on the transistors of the SRAM cell. In the present disclosure, "P-type high-threshold voltage (PHVT) ion implantation conditions" refer to the ion implantation conditions for forming a P-type transistor (e.g., PMOS) having a high threshold voltage (HVt); "N-type standard threshold voltage (NSTV) ion implantation conditions" refer to the ion implantation conditions for forming an N-type transistor (e.g., NMOS) having a standard threshold voltage (SVt); and "N-type low-threshold voltage (NLVT) ion implantation conditions" refer to the ion implantation conditions for forming an N-type transistor (e.g., NMOS) having a low threshold voltage (LVt).

In one embodiment, the P-type high-threshold voltage (PHVT) ion implantation conditions are used for the ion implantation of the pull-up (PU) transistor; the N-type standard threshold voltage (NSTV) ion implantation conditions are used for the ion implantation of the transfer gate (PG) transistor; and the N-type low-threshold voltage (NLVT) ion implantation conditions are used for the ion implantation of the pull-down (PD) transistor.

In one embodiment, by adjusting the P-type high-threshold voltage (PHVT) ion implantation conditions for the pull-up (PU) transistor and the N-type standard threshold voltage (NSTV) ion implantation conditions for the transfer gate (PG) transistor, an $\alpha$ ratio greater than 1.5 may be obtained.

In one embodiment, by adjusting the P-type high-threshold voltage (PHVT) ion implantation conditions for the pull-up (PU) transistor, the N-type standard threshold voltage (NSTV) ion implantation conditions of the transfer gate (PG) transistor, and the N-type low threshold voltage (NLVT) ion implantation conditions of the pull-down (PD) transistor, a $\beta$ ratio greater than 1.2 and a $\gamma$ ratio less than 0.6 may be obtained.

Step S104 in the exemplary method of FIG. 2 differs from Step E4 in the method of FIG. 1 as follows. In Step E4 (FIG. 1), the same ion implantation conditions are used for the transistors of the SRAM cell. Specifically, in Step E4, standard threshold voltage (SVt) ion implantation conditions are used for the ion implantation of the pull-up (PU), pull-down (PD), and transfer gate (PG) transistors of the SRAM cell. In contrast, in Step S104 (FIG. 2), different ion implantation conditions are used for the ion implantation of the pull-up (PU) transistor, pull-down (PD) transistor, and transfer gate (PG) transistor, in order to adjust and obtain the desired $\alpha$, $\beta$, and $\gamma$ ratios.

In the present embodiment, using Step S104 (employing different ion implantation conditions for different transistors) and Step S102 (adjusting the critical dimension of the gate electrode using OPC techniques), the $\alpha$, $\beta$, and $\gamma$ ratios of the SRAM device can be adjusted so as to satisfy device specifications and improve performance.

In Step S105, lightly doped drain (LDD) ion implantation and pocket area (PKT) ion implantation are performed on other transistors of the semiconductor device (excluding the transistors of the SRAM cell). The other transistors may include a core transistor. The aforementioned ion implantation processes in Step S105 generally include standard threshold voltage (SVt) ion implantation and high threshold voltage (HVt) ion implantation.

In Step S106, the source electrode and the drain electrode are formed for each transistor. The source and drain electrodes may be formed using ion implantation or any other suitable processes.

A method of manufacturing a semiconductor device including a SRAM cell according to different embodiments has been described above in Steps S101 through S106. However, the inventive concept is not limited to the above and may include additional steps.

For example, in one embodiment, a step for forming an isolation structure may be added between Steps S102 and S103. In another embodiment, a step for forming interconnects and inter-layer dielectric (ILD) layers may be added after Step S106. The additional steps may be performed using processes known to those skilled in the art, and therefore a detailed description of those additional steps shall be omitted.

It should be clarified that in the steps described in FIGS. 1 through 3, "performing ion implantation on the transistors" means that ion implantation is performed on regions of the semiconductor substrate corresponding to locations where the transistors are to be formed. As such, the ion implantation steps constitute part of the process for fabricating the transistors.

According to the exemplary method of manufacturing the semiconductor device, the high-threshold voltage (HVT) ion implantation conditions, standard threshold voltage (STV) ion implantation conditions, and low-threshold voltage (LVT) ion implantation conditions are used for the lightly doped drain (LDD) ion implantation and pocket area (PKT) ion implantation of the pull-up (PU) transistor, transfer gate (PG) transistor, and pull-down (PD) transistor of the SRAM cell, respectively. As a result, the SRAM cell fabricated using the exemplary method can achieve $\alpha$, $\beta$, and $\gamma$ ratios that meet device specifications. Also, the performance and manufacturing yield of the SRAM cell can be improved, thereby improving the overall performance of the semiconductor device.

In addition, when forming the gate electrode using the exemplary method, optical proximity correction (OPC) techniques may be used to increase the critical dimension (CD) of the gate electrode of the pull-up (PU) transistor and/or reduce the critical dimension (CD) of the gate electrode of the pull-down (PD) transistor, so as to yield $\alpha$, $\beta$, and $\gamma$ ratios that meet device specifications. Also, the performance and manufacturing yield of the SRAM cell can be improved, thereby improving the overall performance of the semiconductor device.

An exemplary method of manufacturing a semiconductor device including a SRAM cell has been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A method of manufacturing a semiconductor device, comprising:
   forming a fin structure on a semiconductor substrate;
   forming a well region in the semiconductor substrate by ion implantation so as to form transistors, wherein the transistors include a pull-up (PU) transistor, a transfer gate (PG) transistor, and a pull-down (PD) transistor of a static random-access memory (SRAM) cell;
   the ion implantation being used to adjust threshold voltages of the transistors, wherein standard threshold voltage (SVt) ion implantation conditions are used to adjust a first threshold voltage of the PU transistor and a second threshold voltage of the PG transistor, and low threshold voltage (LVt) ion implantation conditions are used to adjust a third threshold voltage of the PD transistor;
   forming a gate electrode for each transistor; and
   performing lightly doped drain (LDD) ion implantation and pocket area (PKT) ion implantation on the PU, PG, and PD transistors of the SRAM cell,
   wherein P-type high-threshold voltage (PHVT) ion implantation conditions are used for the LDD ion implantation and PKT ion implantation of the PU transistor; N-type standard threshold voltage (NSTV) ion implantation conditions are used for the LDD ion implantation and PKT ion implantation of the PG transistor; and N-type low-threshold voltage (NLVT) ion implantation conditions are used for the LDD ion implantation and PKT ion implantation of the PD transistor.

2. The method according to claim 1, wherein the SRAM cell has an $\alpha$ ratio, a $\beta$ ratio, and a $\gamma$ ratio;
   wherein the $\alpha$ ratio is a ratio of a saturation current of the PG transistor to a saturation current of the PU transistor; the $\beta$ ratio is a ratio of a saturation current of the PD transistor to a saturation current of the PG transistor; and the $\gamma$ ratio is a ratio of a saturation current of the PU transistor to a saturation current of the PD transistor.

3. The method according to claim 2, wherein the PHVT ion implantation conditions for the PU transistor and the NSTV ion implantation conditions for the PG transistor are adjusted such that the $\alpha$ ratio of the SRAM cell is greater than 1.5.

4. The method according to claim 3, wherein the $\alpha$ ratio of the SRAM cell is about 2.

5. The method according to claim 2, wherein the PHVT ion implantation conditions for the PU transistor, the NSTV ion implantation conditions for the PG transistor, and the NLVT ion implantation conditions for the PD transistor are adjusted such that the $\beta$ ratio of the SRAM cell is greater than 1.2 and the $\gamma$ ratio of the SRAM cell is less than 0.6.

6. The method according to claim 2, wherein, when forming the gate electrode for each transistor of the SRAM cell:
   a critical dimension (CD) of the gate electrode of the PU transistor is increased such that the $\alpha$ ratio of the SRAM cell is greater than 1.5 and the $\gamma$ ratio of the SRAM cell is less than 0.6.

7. The method according to claim 6, wherein the CD of the gate electrode of the PU transistor is increased using optical proximity correction (OPC) techniques.

8. The method according to claim 2, wherein, when forming the gate electrode for each transistor:
   a critical dimension (CD) of the gate electrode of the PD transistor is reduced so as to reduce the $\gamma$ ratio of the SRAM cell.

9. The method according to claim 8, wherein the CD of the gate electrode of the PD transistor is reduced using optical proximity correction (OPC) techniques.

10. The method according to claim 1, wherein the transistors include other transistors of the semiconductor device excluding the PU, PG, and PD transistors of the SRAM cell, the method further comprising:
    performing the LDD ion implantation and PKT ion implantation on the other transistors of the semiconductor device.

11. The method according to claim 10, further comprising:
    forming a source electrode and a drain electrode for each transistor of the semiconductor device including the PU, PG, and PD transistors of the SRAM cell.

12. The method according to claim 1, wherein the gate electrode is a polysilicon gate.

* * * * *